(12) United States Patent
Lee et al.

(10) Patent No.: US 12,308,307 B2
(45) Date of Patent: May 20, 2025

(54) THROUGH MOLD VIA FRAME

(71) Applicant: ROCKLEY PHOTONICS LIMITED, Altrincham (GB)

(72) Inventors: Seungjae Lee, Pasadena, CA (US); Brett Sawyer, Pasadena, CA (US); Gerald Cois Byrd, Shadow Hills, CA (US)

(73) Assignee: Rockley Photonics Limited, Altrincham (GB)

( * ) Notice: Subject to any disclaimer, the term of this patent is extended or adjusted under 35 U.S.C. 154(b) by 137 days.

(21) Appl. No.: 17/597,473

(22) PCT Filed: Jul. 10, 2020

(86) PCT No.: PCT/EP2020/069646
§ 371 (c)(1),
(2) Date: Jan. 6, 2022

(87) PCT Pub. No.: WO2021/005235
PCT Pub. Date: Jan. 14, 2021

(65) Prior Publication Data
US 2022/0319971 A1 Oct. 6, 2022

Related U.S. Application Data

(60) Provisional application No. 62/872,652, filed on Jul. 10, 2019.

(51) Int. Cl.
*H01L 23/498* (2006.01)
*G02B 6/42* (2006.01)
(Continued)

(52) U.S. Cl.
CPC ........ *H01L 23/49827* (2013.01); *G02B 6/428* (2013.01); *G02B 6/43* (2013.01);
(Continued)

(58) Field of Classification Search
CPC . H01L 23/498; H01L 21/48; H01L 23/49827; H01L 21/486; G02B 6/428; G02B 6/43
(Continued)

(56) References Cited

U.S. PATENT DOCUMENTS

| 5,689,091 A | 11/1997 | Hamzehdoost et al. |
| 6,080,336 A | 6/2000 | Suehiro et al. |

(Continued)

FOREIGN PATENT DOCUMENTS

| CN | 104051399 A | 9/2014 |
| CN | 106653703 A | 5/2017 |

(Continued)

OTHER PUBLICATIONS

Chinese Notification of the First Office Action, for Patent Application No. 201980038846.5, mailed Jan. 26, 2022, 9 pages.
(Continued)

*Primary Examiner* — Tremesha W Burns
(74) *Attorney, Agent, or Firm* — Womble Bond Dickinson (US) LLP (57) ABSTRACT

A via frame. In some embodiments, the via frame includes: a sheet of epoxy mold compound, having a plurality of holes each extending through the sheet of epoxy mold compound, and a plurality of conductive elements, each extending through a respective one of the holes.

19 Claims, 11 Drawing Sheets

(51) Int. Cl.

| | | |
|---|---|---|
| *G02B 6/43* | (2006.01) | |
| *H01L 21/48* | (2006.01) | |
| *H01L 23/31* | (2006.01) | |
| *H05K 1/02* | (2006.01) | |
| *H05K 3/40* | (2006.01) | |

(52) U.S. Cl.
CPC ........ *H01L 21/486* (2013.01); *H01L 23/3128* (2013.01); *H05K 1/0274* (2013.01); *H05K 3/4069* (2013.01); *H05K 2201/10378* (2013.01)

(58) Field of Classification Search
USPC ........................................................ 361/761
See application file for complete search history.

(56) References Cited

U.S. PATENT DOCUMENTS

| | | |
|---|---|---|
| 8,487,420 B1 | 7/2013 | Hwang et al. |
| 8,781,267 B2 | 7/2014 | Julien et al. |
| 8,824,837 B2 | 9/2014 | Ren et al. |
| 9,082,745 B2 | 7/2015 | Morris |
| 9,195,079 B2 | 11/2015 | Doerr et al. |
| 9,391,708 B2 | 7/2016 | Fincato et al. |
| 9,418,965 B1 | 8/2016 | Li et al. |
| 9,490,240 B2 | 11/2016 | Lucero et al. |
| 9,496,248 B2 | 11/2016 | Lee et al. |
| 9,515,746 B2 | 12/2016 | Flens et al. |
| 9,557,478 B2 | 1/2017 | Doerr et al. |
| 9,575,267 B1 | 2/2017 | Shastri et al. |
| 9,874,688 B2 | 1/2018 | Doerr et al. |
| 9,935,088 B2 | 4/2018 | Budd et al. |
| 10,872,854 B2 | 12/2020 | Raghunathan et al. |
| 10,962,728 B2 | 3/2021 | Nelson et al. |
| 11,054,597 B2 | 7/2021 | Raghunathan et al. |
| 2004/0150081 A1 | 8/2004 | Ogawa |
| 2005/0124197 A1 | 6/2005 | Okimoto et al. |
| 2006/0177173 A1 | 8/2006 | Shastri et al. |
| 2012/0014639 A1 | 1/2012 | Doany et al. |
| 2013/0230272 A1 | 9/2013 | Raj et al. |
| 2013/0308898 A1 | 11/2013 | Doerr et al. |
| 2014/0064659 A1 | 3/2014 | Doerr et al. |
| 2014/0203175 A1 | 7/2014 | Kobrinsky et al. |
| 2014/0353840 A1 | 12/2014 | Yap et al. |
| 2015/0171019 A1 | 6/2015 | Shibuya et al. |
| 2015/0294953 A1 | 10/2015 | Chen et al. |
| 2015/0348946 A1 | 12/2015 | Dohi |
| 2015/0371960 A1* | 12/2015 | Yap .......................... H01L 24/09 257/664 |
| 2016/0013866 A1 | 1/2016 | Doerr |
| 2016/0124164 A1 | 5/2016 | Doerr |
| 2017/0186670 A1 | 6/2017 | Budd et al. |
| 2017/0236788 A1 | 8/2017 | Lin et al. |
| 2018/0174935 A1* | 6/2018 | Chong .................... H01L 24/96 |
| 2019/0243066 A1 | 8/2019 | Mahgerefteh et al. |
| 2019/0243164 A1 | 8/2019 | Nelson et al. |
| 2020/0161243 A1 | 5/2020 | Lee et al. |
| 2020/0225430 A1 | 7/2020 | Sawyer et al. |
| 2020/0386581 A1* | 12/2020 | Hoyt ........................ G01R 33/26 |
| 2021/0104854 A1* | 4/2021 | Tsuchiya .............. H01R 43/205 |
| 2021/0311269 A1 | 10/2021 | Goergen et al. |

FOREIGN PATENT DOCUMENTS

| | | |
|---|---|---|
| CN | 107076933 A | 8/2017 |
| EP | 2 820 461 | 9/2013 |
| JP | 2011-233836 A | 11/2011 |
| JP | 2012-015548 A | 1/2012 |
| KR | 10-2017-0073706 | 6/2017 |
| WO | WO 2011/135900 A1 | 11/2011 |
| WO | WO 2013/130831 A2 | 9/2013 |
| WO | WO 2013/165344 A1 | 11/2013 |
| WO | WO 2014/014846 A2 | 1/2014 |
| WO | WO 2016/077500 A8 | 5/2016 |
| WO | WO 2019/197896 A1 | 10/2019 |

OTHER PUBLICATIONS

International Search Report and Written Opinion of the International Searching Authority, Mailed Oct. 9, 2019, Corresponding to PCT/IB2019/000607, 13 pages.

International Search Report and Written Opinion of the International Searching Authority, Mailed Sep. 23, 2019, Corresponding to PCT/IB2019/000382, 13 pages.

International Search Report and Written Opinion of the International Searching Authority, Mailed Sep. 30, 2019, Corresponding to PCT/IB2019/000383, 13 pages.

International Search Report and Written Opinion of the International Searching Authority, Mailed Aug. 3, 2020, Corresponding to PCT/EP2020/059637, 14 pages.

International Search Report and Written Opinion of the International Searching Authority, for International Application No. PCT/EP2019/081964, dated Mar. 24, 2020, 19 pages.

International Search Report and Written Opinion of the International Searching Authority, Mailed Oct. 7, 2020, Corresponding to PCT/EP2020/069646, 9 pages.

Invitation to Pay Additional Fees and Partial International Search, for International Application No. PCT/EP2019/081964, dated Jan. 31, 2020, 14 pages.

Partial English translation of the Chinese Notification of the First Office Action, for Patent Application No. 201980038846.5, mailed Jan. 26, 2022, 16 pages.

U.K. Intellectual Property Office Examination Report, dated Nov. 10, 2021, for Patent Application No. GB2017774.7, 4 pages.

U.K. Intellectual Property Office Search and Examination Report, dated Jan. 11, 2021, for Patent Application No. GB 2010649.8, 6 pages.

U.S. Office Action from U.S. Appl. No. 16/836,815, dated Nov. 26, 2021, 14 pages.

U.S. Office Action from U.S. Appl. No. 16/382,076, dated May 15, 2020, 9 pages.

U.S. Office Action from U.S. Appl. No. 16/393,763, dated Mar. 18, 2020, 7 pages.

U.S. Office Action from U.S. Appl. No. 16/690,054, dated Jul. 9, 2021, 15 pages.

U.S. Office Action from U.S. Appl. No. 16/690,054, dated Sep. 9, 2021, 12 pages.

Website: "Silicon Wafer Integrated Fan-out Technology (SWIFTTM) Packaging for Highly Integrated Products", Amkor, https://c44f5d406df450f4a66b-1b94a87d576253d9446df0a9ca62e142.ssl.cf2.rackcdn.com/2017/12/SWIFT_Packaging_for_Highly_Integrated_Products_WhitePaper_0617.pdf, printed on Apr. 8, 2018, 4 pages.

Chinese Notification and Partial English translation of the First Office Action, for Patent Application No. 202080050285.3, mailed Jan. 15, 2025, 23 pages.

\* cited by examiner

FIG. 1A

| Symbol | A | B | C | D | E | G |
|---|---|---|---|---|---|---|
| Description | EMC thickness | Top Bump (Cu or Ni) diameter | Via top diameter | Via bottom diameter | Bump thickness | Via pitch |
| Nominal. (um) | 100um ~ 750um | ≥ C+4um | ≥ 50um | ≥ 50um | ≥ 2um | ≥ C+50um |

| Symbol | A | B | C | D | E | G | H | J |
|---|---|---|---|---|---|---|---|---|
| Description | EMC thickness | Top Bump (Cu or Ni) diameter | Via top diameter | Via bottom diameter | Top Bump thickness | Via pitch | Bottom bump (Cu or Au or Ni or Solder) diameter | Bottom bump thickness |
| Nominal. (um) | 100um ~ 750um | ≥ C+4um | ≥ 50um | ≥ 50um | ≥ 2um | ≥ C+50um | ≥ D+4um | ≥ 2um |

| Symbol | A | B | C | D | E | G |
|---|---|---|---|---|---|---|
| Description | EMC thickness | Top UBM diameter | Via top diameter | Via bottom diameter | UBM thickness | Via pitch |
| Nominal. (um) | 100um ~ 750um | ≥C+4um | ≥50um | ≥50um | ≥2um | ≥C+50um |

| Symbol | A | B | C | D | E | G | H | J | K | L |
|---|---|---|---|---|---|---|---|---|---|---|
| Description | EMC thickness | Top Bump (Cu or Ni) diameter | Via top diameter | Via bottom diameter | Top Bump thickness | Via pitch | Bottom bump (Cu or Au or Ni or Solder) diameter | Bottom Bump thickness | IC thickness | Top ball height |
| Nominal. (um) | 100um ~ 750um | $\geq$ C+4um | $\geq$ 50um | $\geq$ 50um | $\geq$ 2um | $\geq$ C+50um | $\geq$ D+4um | $\geq$ 2um | (A + E + L) - $200 \leq K \leq 725$ | $\geq$ 100 |

THROUGH MOLD VIA FRAME

CROSS-REFERENCE TO RELATED APPLICATIONS

The present application is a U.S. National Phase Patent Application of International Application Number PCT/EP2020/069646, filed on Jul. 10, 2020, which claims priority to and the benefit of U.S. Provisional Application No. 62/872,652, filed Jul. 10, 2019, entitled "THROUGH MOLD VIA FRAME", the entire content of each of which is incorporated herein by reference.

FIELD

One or more aspects of embodiments according to the present disclosure relate to electro-optical packaging, and more particularly to a via frame that may be used in such packaging.

BACKGROUND

In optical transceivers operating at high data rates, short electrical interconnects, e.g., between electro-optical components, interface integrated circuits for interfacing with the electro-optical components, and one or more digital integrated circuits (e.g., CMOS packet switching circuits) may help to preserve signal integrity. Thus, there a need for a packaging solution that accommodates such components and provides short electrical interconnects between them.

SUMMARY

According to an embodiment of the present invention, there is provided a via frame, including: a sheet of epoxy mold compound, having a plurality of holes each extending through the sheet of epoxy mold compound, and a plurality of conductive elements, each extending through a respective one of the holes.

In some embodiments, each of the conductive elements is a metal-filled epoxy element.

In some embodiments, each of the conductive elements includes copper-filled epoxy.

In some embodiments, the copper-filled epoxy includes a plurality of silver-coated copper particles in a cured epoxy matrix.

In some embodiments, the sheet of epoxy mold compound has a thickness greater than 70 microns and less than 1000 microns.

In some embodiments, a center-to-center separation between two holes of the plurality of holes is greater than 100 microns and less than 300 microns.

In some embodiments, the via frame further includes a plurality of first conductive bumps on a first surface of the sheet of epoxy mold compound, each of the first conductive bumps protruding from the first surface of the sheet of epoxy mold compound and being electrically connected to a respective one of the plurality of conductive elements.

In some embodiments, each of the first conductive bumps is composed of a material selected from the group consisting of copper, nickel, gold, and alloys and combinations thereof.

In some embodiments, each of the first conductive bumps has a diameter that exceeds a diameter, at the first surface, of the hole containing the conductive element to which the first conductive bump is electrically connected, by at least 4 microns.

In some embodiments, the via frame further includes a plurality of second conductive bumps on a second surface of the sheet of epoxy mold compound, each of the second conductive bumps protruding from the second surface of the sheet of epoxy mold compound and being electrically connected to a respective one of the plurality of conductive elements.

In some embodiments, each of the second conductive bumps is composed of a material selected from the group consisting of copper, gold, nickel, and solder.

In some embodiments, each of the second conductive bumps has a diameter that exceeds a diameter, at the second surface, of the hole containing the conductive element to which the second conductive bump is electrically connected, by at least 4 microns.

According to an embodiment of the present invention, there is provided an interposer, including: a photonic integrated circuit; an electro-optical chip, on the photonic integrated circuit; an electronic integrated circuit, on the photonic integrated circuit; a via frame, on the photonic integrated circuit; and a plurality of conductive balls on a first surface of the via frame, wherein: the electronic integrated circuit is electrically connected to the electro-optical chip, and a conductive element of the plurality of conductive elements of the via frame is part of a conductive path between the electronic integrated circuit and a conductive ball of the plurality of conductive balls.

According to an embodiment of the present invention, there is provided a method for fabricating a via frame, the method including: drilling, through a sheet of epoxy mold compound, a plurality of holes; filling each of the holes with a metal-filled paste, to form a plurality of conductive elements; grinding a first surface of the sheet of epoxy mold compound; forming a plurality of first conductive bumps on the first surface of the sheet of epoxy mold compound, each of the first conductive bumps protruding from the first surface of the sheet of epoxy mold compound and being electrically connected to a respective one of the plurality of conductive elements; grinding a second surface of the sheet of epoxy mold compound; and dicing the sheet of epoxy mold compound into a plurality of pieces.

In some embodiments, the method further includes forming a plurality of second conductive bumps on the second surface of the sheet of epoxy mold compound, each of the second conductive bumps protruding from the second surface of the sheet of epoxy mold compound and being electrically connected to a respective one of the plurality of conductive elements.

In some embodiments, the metal-filled paste is a metal-filled epoxy paste.

In some embodiments, the metal-filled paste is a copper-filled epoxy paste.

In some embodiments, the copper-filled epoxy paste includes a plurality of silver-coated copper particles in a cured epoxy matrix.

In some embodiments, the sheet of epoxy mold compound has a thickness greater than 70 microns and less than 1000 microns.

In some embodiments, a center-to-center separation between two holes of the plurality of holes is greater than 100 microns and less than 300 microns.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a through mold via frame provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
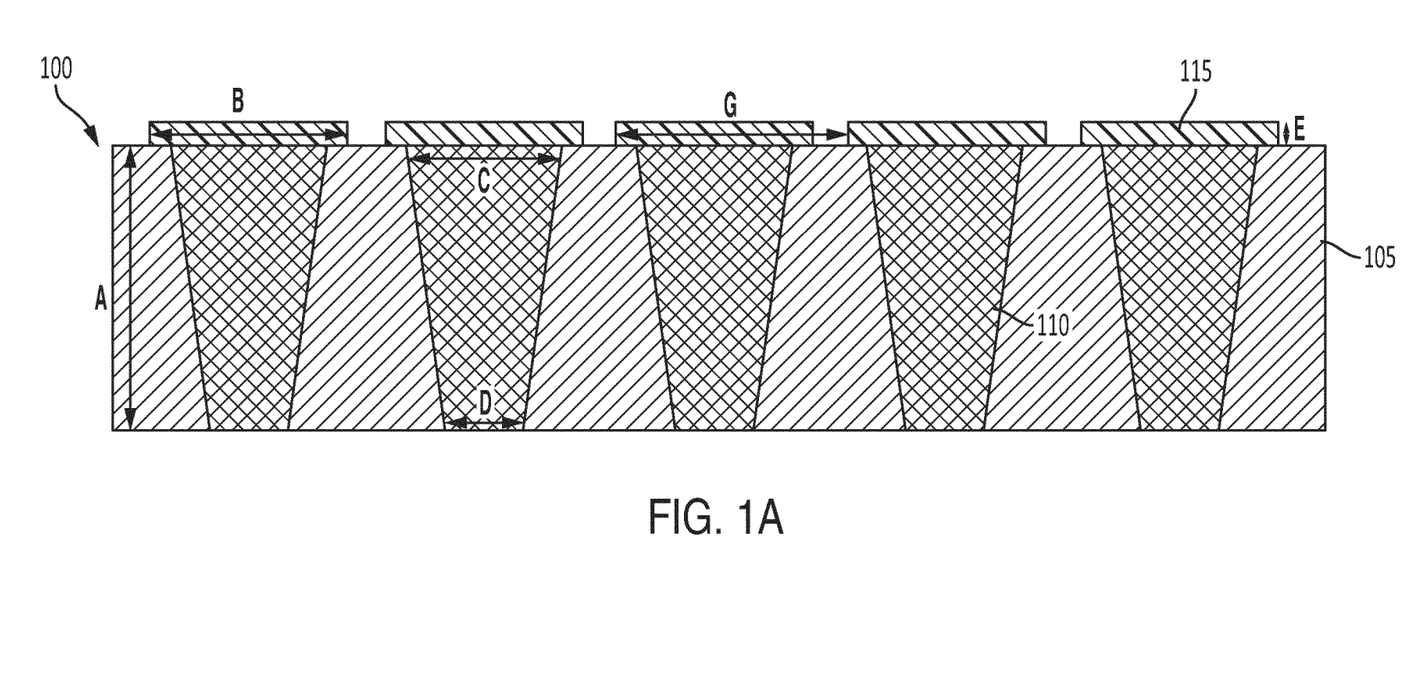
FIG. 1A is a schematic cross-sectional view of a via frame, according to an embodiment of the present disclosure.
Figure 1B:
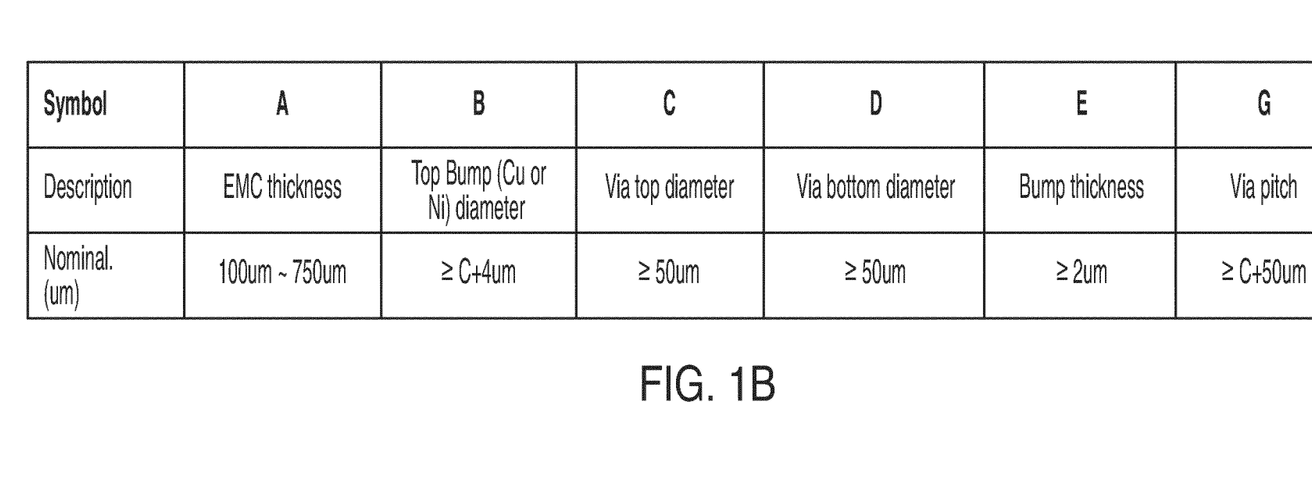
FIG. 1B is a table of dimensions for the embodiment of FIG. 1A.

FIG. 1A shows a via frame 100 of a first kind, which may be referred to as a "through mold via frame single bump" (TMVFS), according to some embodiments. A sheet of epoxy mold compound (EMC) 105 has a plurality (e.g., an array, or a grid) of holes (or "vias") 110 filed with a conductive element composed of a conductive material (e.g., metal paste, such as copper paste, or sintering paste). Each of the holes may be tapered, with a taper angle, of, e.g., between 5 degrees and 20 degrees. A plurality of first conductive bumps 115 may be formed on a first surface (which may be referred to as the "top" surface) of the sheet of epoxy mold compound 105. Each of the conductive bumps may protrude above the top surface of the sheet of epoxy mold compound 105 and be electrically connected to a respective one of the conductive elements in the holes 110. The conductive bumps may be composed of copper or nickel (e.g., plated copper or nickel); their composition and structure may be selected to support a subsequent ball drop (e.g., the attachment of a conductive ball). The table of FIG. 1B shows dimensions, or ranges of dimensions, for features of the structure of FIG. 1A, in some embodiments.

Figure 2A:
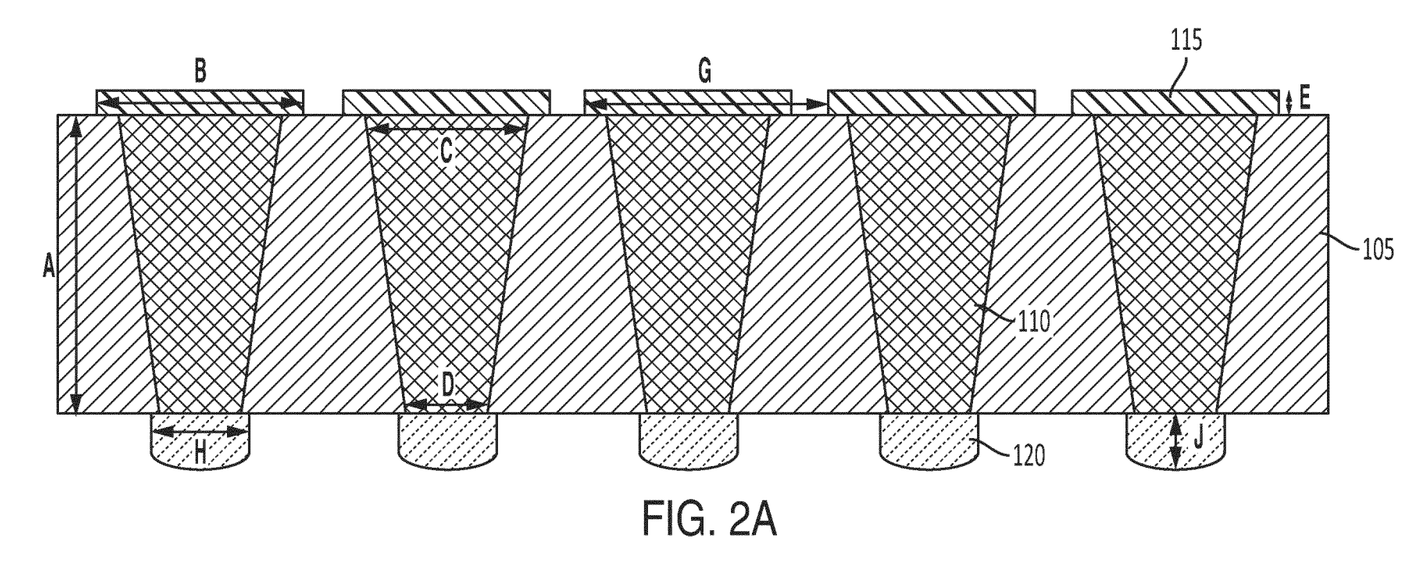
FIG. 2A is a schematic cross-sectional view of a via frame, according to an embodiment of the present disclosure.
Figure 2B:
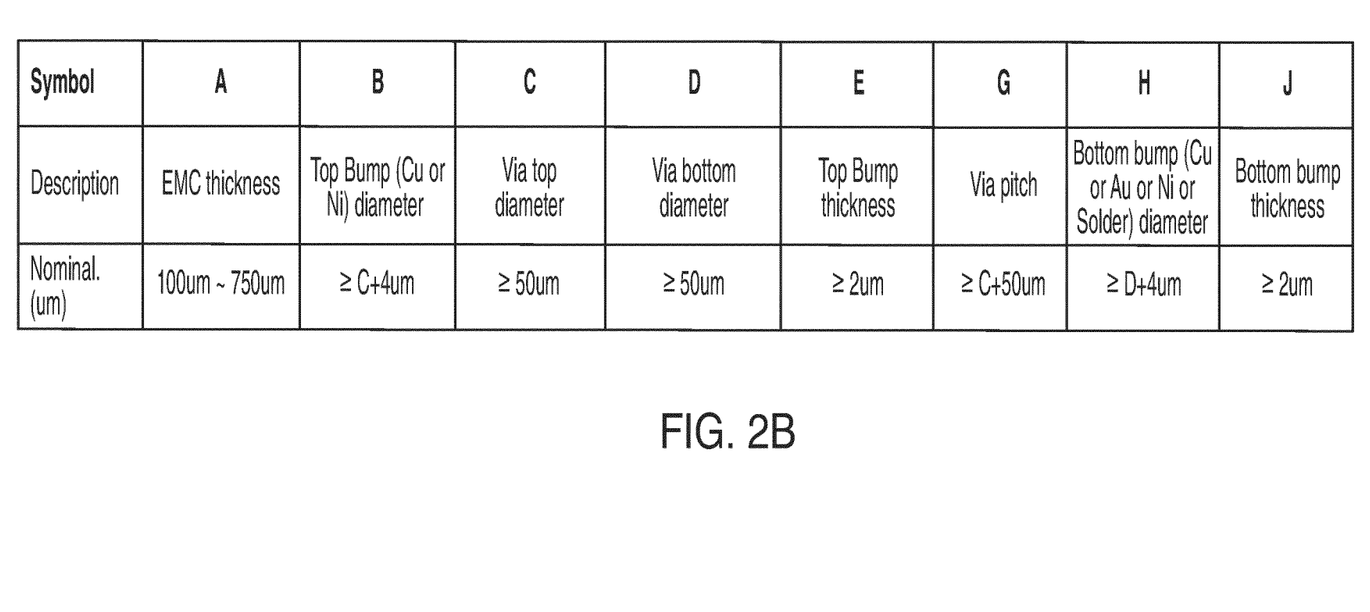
FIG. 2B is a table of dimensions for the embodiment of FIG. 2A.

FIG. 2A shows a via frame 100 of a second kind, which may be referred to as a "through mold via frame double bump" (TMVFD), according to some embodiments. In the embodiment of FIG. 2A, a plurality of second conductive bumps 120 is formed on a second surface (which may be referred to as the "bottom" surface) of the sheet of epoxy mold compound 105. The table of FIG. 2B shows dimensions, or ranges of dimensions, for features of the structure of FIG. 2A, in some embodiments. Each of the second conductive bumps 120 may be composed of a suitable (e.g., lead-free) solder.

Figure 3A:
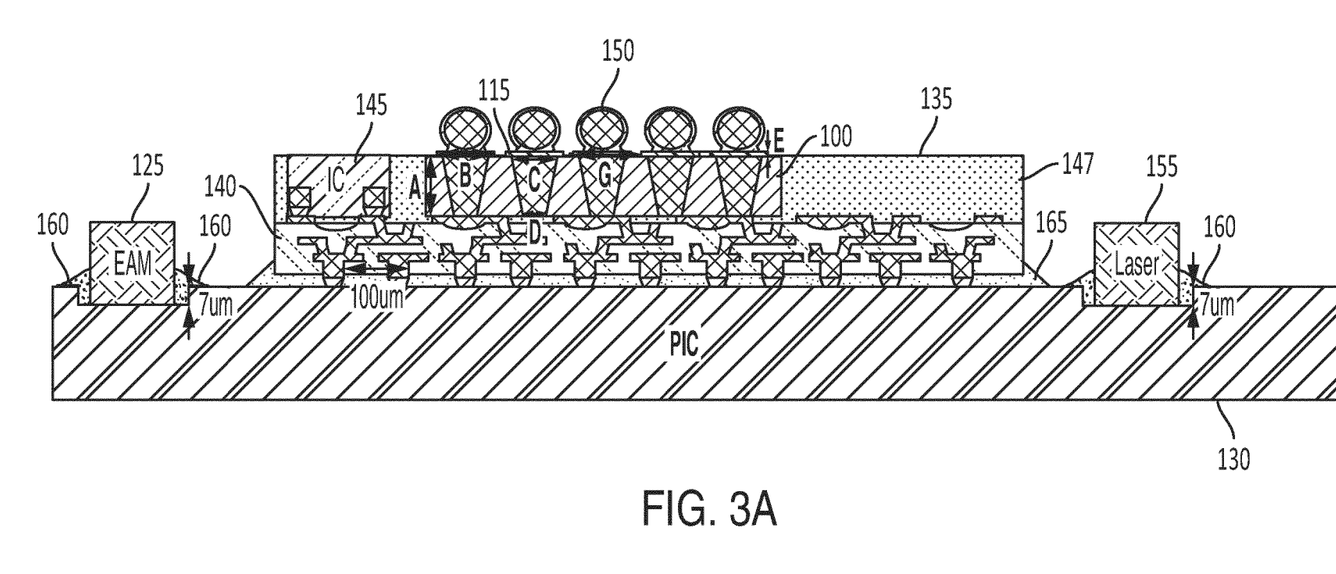
FIG. 3A is a schematic cross-sectional view of an interposer, according to an embodiment of the present disclosure.

FIG. 3A shows an interposer, according to some embodiments. A first electro-optical chip 125 is on a top surface of (e.g., mounted, as shown, in a cavity in a top surface of) a photonic integrated circuit 130. A fan-out wafer level package (FOWLP) 135 (also on the top surface of the photonic integrated circuit 130) includes a redistribution layer (RDL) 140 (which may include one or more layers of conductive traces, separated by one or more dielectric (e.g., organic dielectric) layers, and connected by vias through the dielectric layers), an electronic integrated circuit 145 (connected to the first electro-optical chip 125 through the redistribution layer 140 and through conductive traces on the top surface of the photonic integrated circuit 130), a via frame 100 (e.g., a single bump via frame ("TMVFS") as illustrated in FIG. 1A), and a plurality of conductive balls 150 on the first conductive bumps 115. An overmold 147 may serve to encapsulate, secure together, and protect the components of the fan-out wafer level package 135. The conductive balls 150 may be employed to make connections to, e.g., a digital integrated circuit (e.g., a CMOS packet switching circuit).

The top surface of the photonic integrated circuit 130 may further include waveguides, for coupling light, e.g., from a second electro-optical chip 155 (which may include one or more continuous wave (unmodulated) lasers) to the first electro-optical chip 125 (which may include an array of modulators, e.g., of electro-absorption modulators (EAMs)). In other embodiments the first electro-optical chip 125 includes a photodetector or an array of photodetectors. If the first electro-optical chip 125 includes a photodetector array, the electronic integrated circuit 145 may include an array of transimpedance amplifiers for amplifying the signals from the photodetectors; if the first electro-optical chip 125 includes a modulator array, the electronic integrated circuit 145 may include an array of modulator drive circuits. As FIG. 3A demonstrates, a via frame 100 (e.g., a TMVFS) may be embedded in a fan-out wafer level package (FOWLP) 135 to make a three-dimensional interconnection; the FOWLP 135 with the embedded via frame 100 may be mounted on a photonic integrated circuit 130 together with an EAM 125 and a laser 155 to form an optical engine.

Figure 3B:
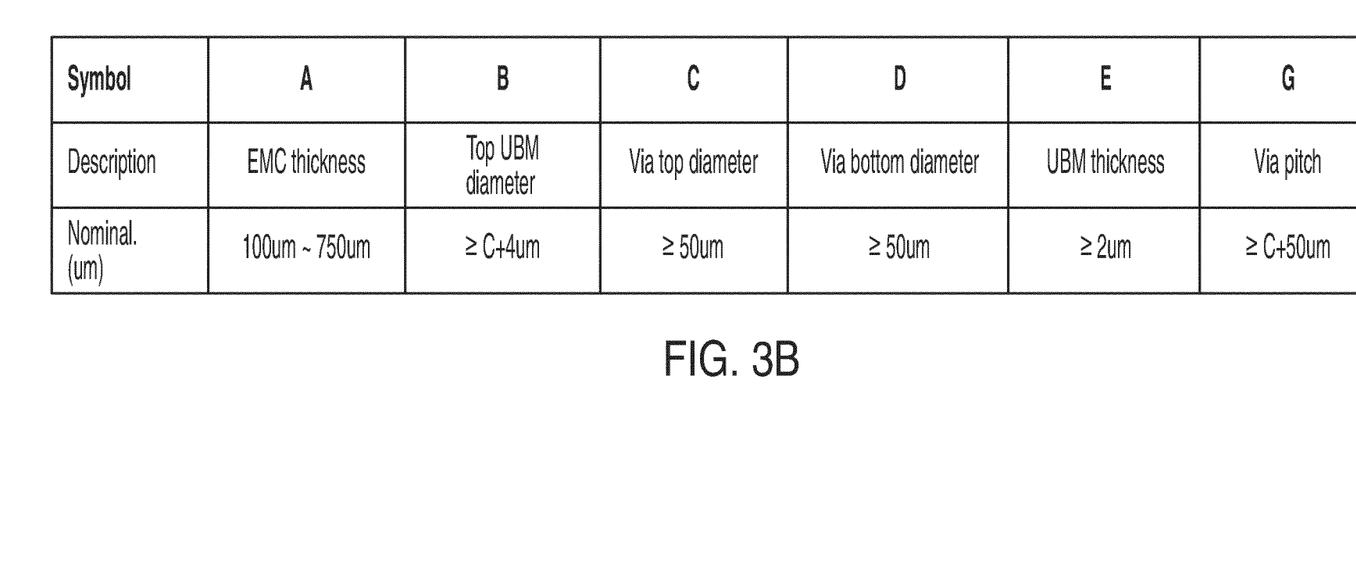
FIG. 3B is a table of dimensions for the embodiment of FIG. 3A.

The photonic integrated circuit 130 may further include mode converters and V-groove structures that couple the light signal from modulators to single mode fibers (SMFs) (i.e., single mode optical fibers) and from SMFs to photodetectors. The mode converters may include tapered waveguides and may be configured to convert optical modes of single-mode fibers to optical modes (e.g., smaller modes) that may propagate in waveguides on the photonic integrated circuit 130 and that may couple (in some embodiments, through additional mode converters) to an electro-optical chip 125. Optical underfill (UF) 160 may fill a gap between the electro-optical chip 125 and a waveguide on the top surface of the photonic integrated circuit 130 to reduce optical loss for light coupling between the waveguide and the electro-optical chip 125, and to prevent contamination of the optical interfaces. Underfill 165 may be used under the fan-out wafer level package 135 to secure it to the top surface of the photonic integrated circuit 130, and to protect the electrical connections between the fan-out wafer level package 135 and the photonic integrated circuit 130. The table of FIG. 3B shows dimensions, or ranges of dimensions, for features of the structure of FIG. 3A, in some embodiments.

Figure 4A:
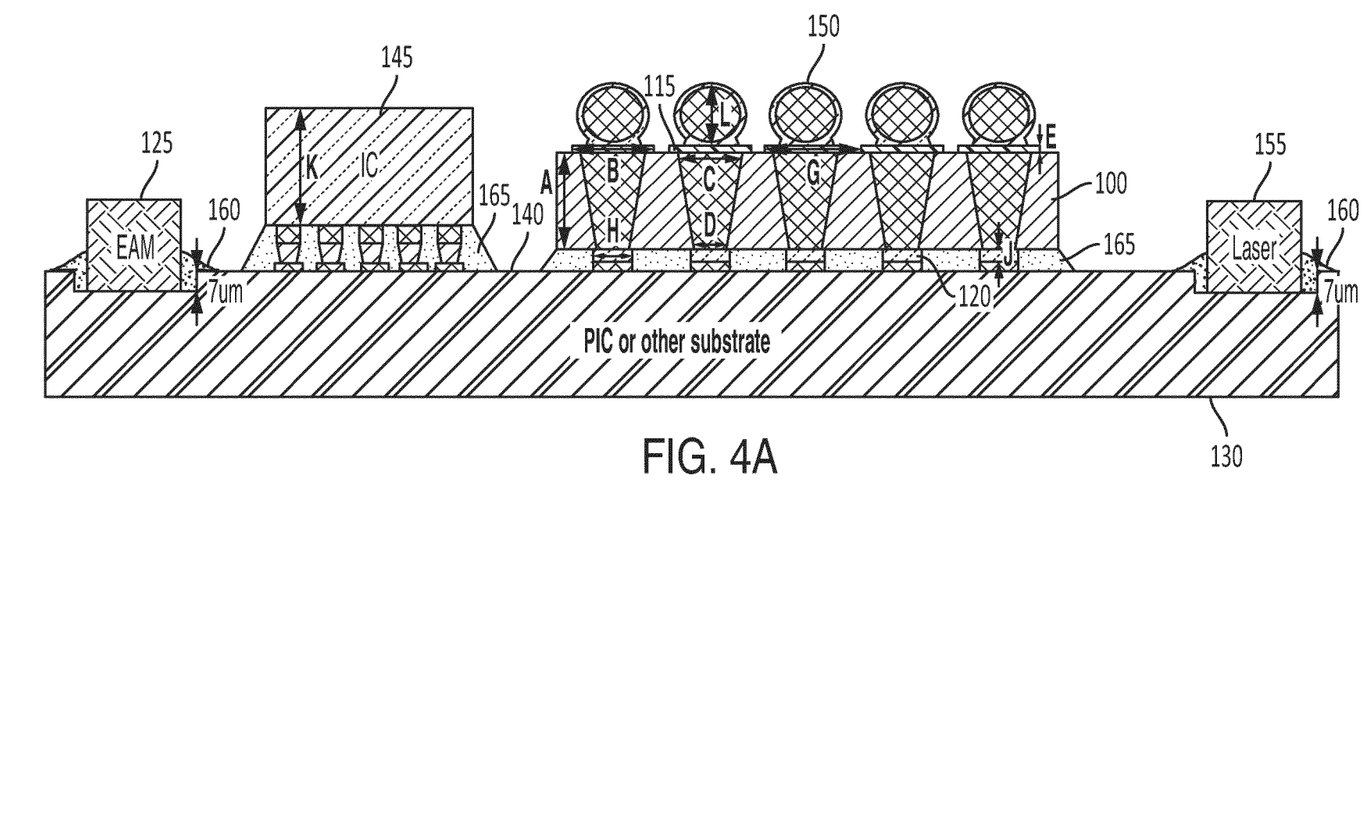
FIG. 4A is a schematic cross-sectional view of an interposer, according to an embodiment of the present disclosure.
Figure 4B:
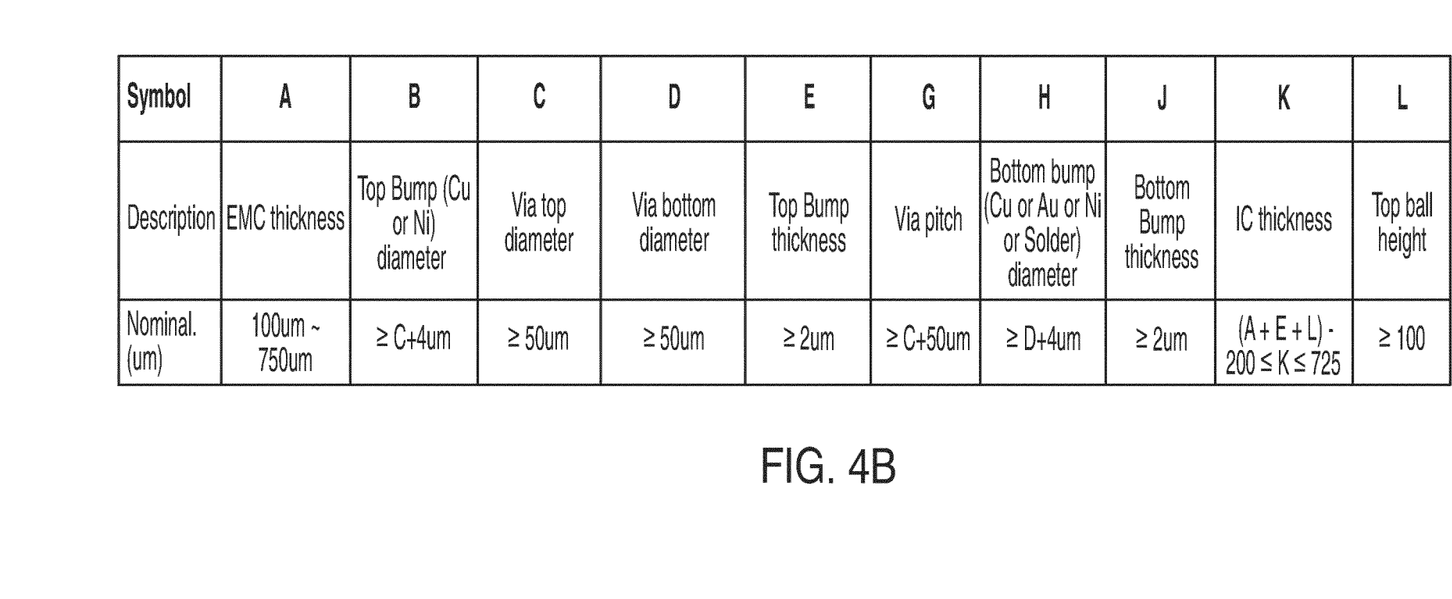
FIG. 4B is a table of dimensions for the embodiment of FIG. 4A.

FIG. 4A shows an interposer, according to some embodiments. As in the embodiment of FIG. 3A, a plurality of conductive balls 150 (e.g., for forming connections to a digital integrated circuit) are formed on the first conductive bumps 115. A redistribution layer 140 (which may include one or more layers of conductive traces, separated by one or more dielectric (e.g., SiO2) layers, and connected by vias through the dielectric layers) is formed on the top surface of the photonic integrated circuit 130, and forms connections between the electro-optical chip 125, the electronic integrated circuit 145, and the plurality of second conductive bumps 120 on the bottom surface of the via frame 100. The via frame 100 or the fan-out wafer level package 135 (e.g., the fan-out wafer level package 135 of FIG. 3A) may be mounted on the photonic integrated circuit 130 using, e.g., mass reflow, thermal compression bonding, or laser assisted bonding. The structure of FIG. 4A may be referred to as a "chip-on-chip" structure or as a "package-on-chip" structure. The table of FIG. 4B shows dimensions, or ranges of dimensions, for features of the structure of FIG. 4A, in some embodiments.

Figure 5A:
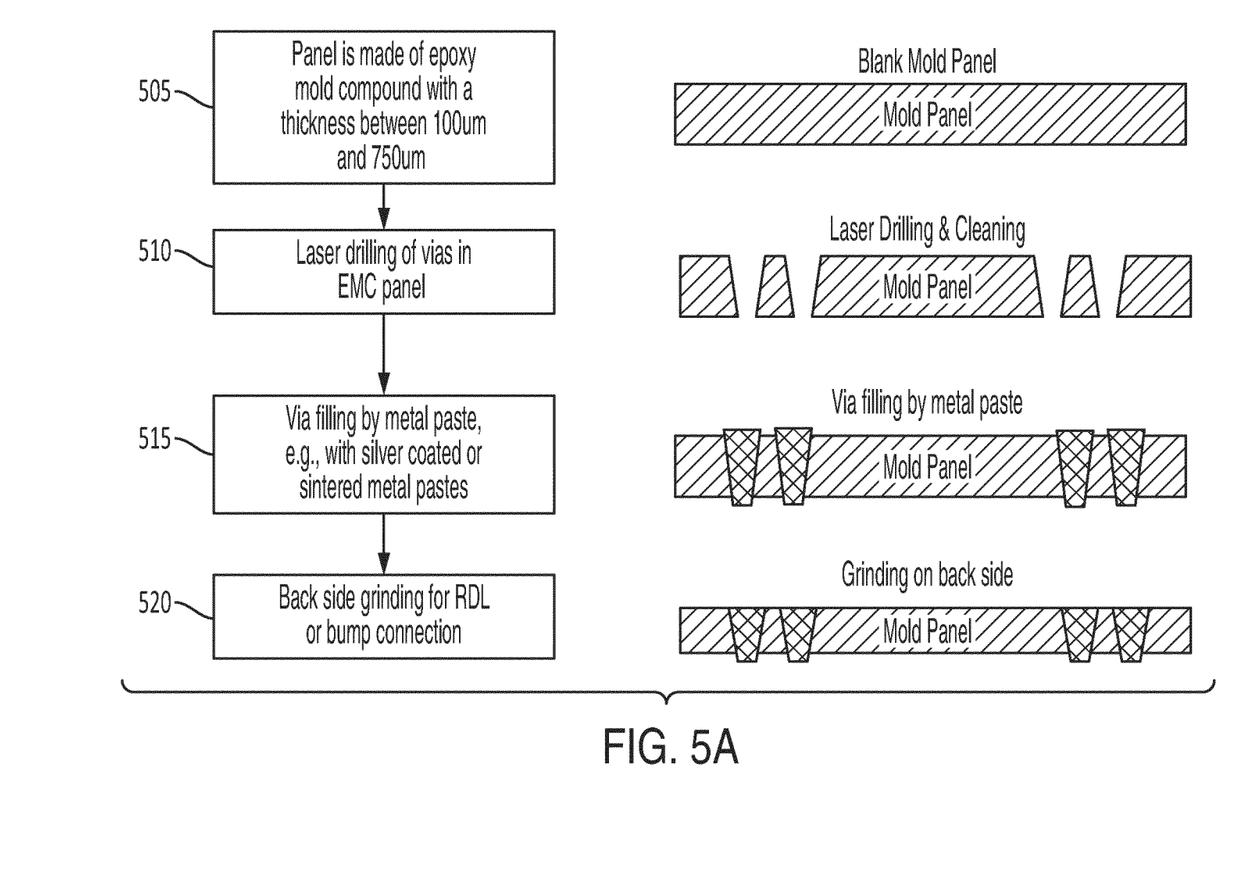
FIG. 5A is an illustrated flow chart of a portion of a method for fabricating a via frame, according to an embodiment of the present disclosure.

FIG. 5A shows four initial steps in a method of fabricating a via frame, such as those of FIGS. 1A and 2A, according to some embodiments. The result of each step is illustrated in a drawing to the right of the box describing the step. The starting material is, at 505, a large sheet of epoxy mold compound (larger than the sheet present in the completed via frame 100). The large sheet of epoxy mold compound may be formed (e.g., by compression or transfer molding) from epoxy mold compound in liquid, powder, or granular form. The sheet of epoxy mold compound has formed in it, at 510, a plurality (e.g., an array) of holes, each hole being a through hole. Laser drilling (e.g., drilling using an infrared laser, or, for smaller or more precise holes, an excimer laser) may be used. The holes are filled, at 515, with a conductive paste, which may be an epoxy paste filled with metal particles (e.g., copper or silver particles, or copper particles coated with silver), such as Tatsuta conductive copper paste. Vacuum printing may be used to fill the holes with the conductive paste. The conductive paste is cured, forming a solid conductive element (e.g., a conductive element including a plurality of metal particles in a cured epoxy matrix) in each of the holes. The top surface (or the "back side") of the sheet of epoxy mold compound may then be ground flat, at 520.

Figure 5B:
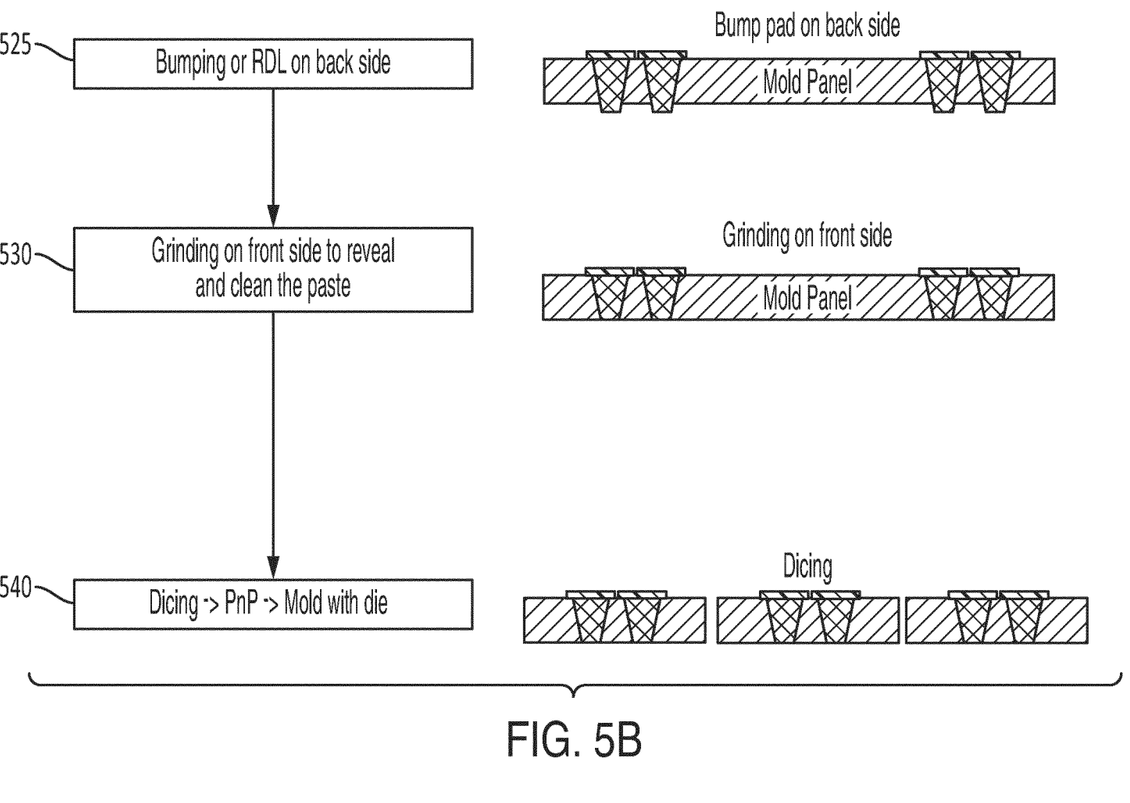
FIG. 5B is an illustrated flow chart of a portion of a method for fabricating a via frame, according to an embodiment of the present disclosure.

FIG. 5B shows three additional steps that may be used to form the embodiment of FIG. 1A. At 525, the plurality of first conductive bumps 115 may be formed on the top surface, e.g., by plating with copper or nickel. The bottom surface (or the "front side") of the sheet of epoxy mold compound may then, at 530, be ground flat, and the sheet may be diced, at 540, into pieces, each forming a via frame 100.

Figure 5C:
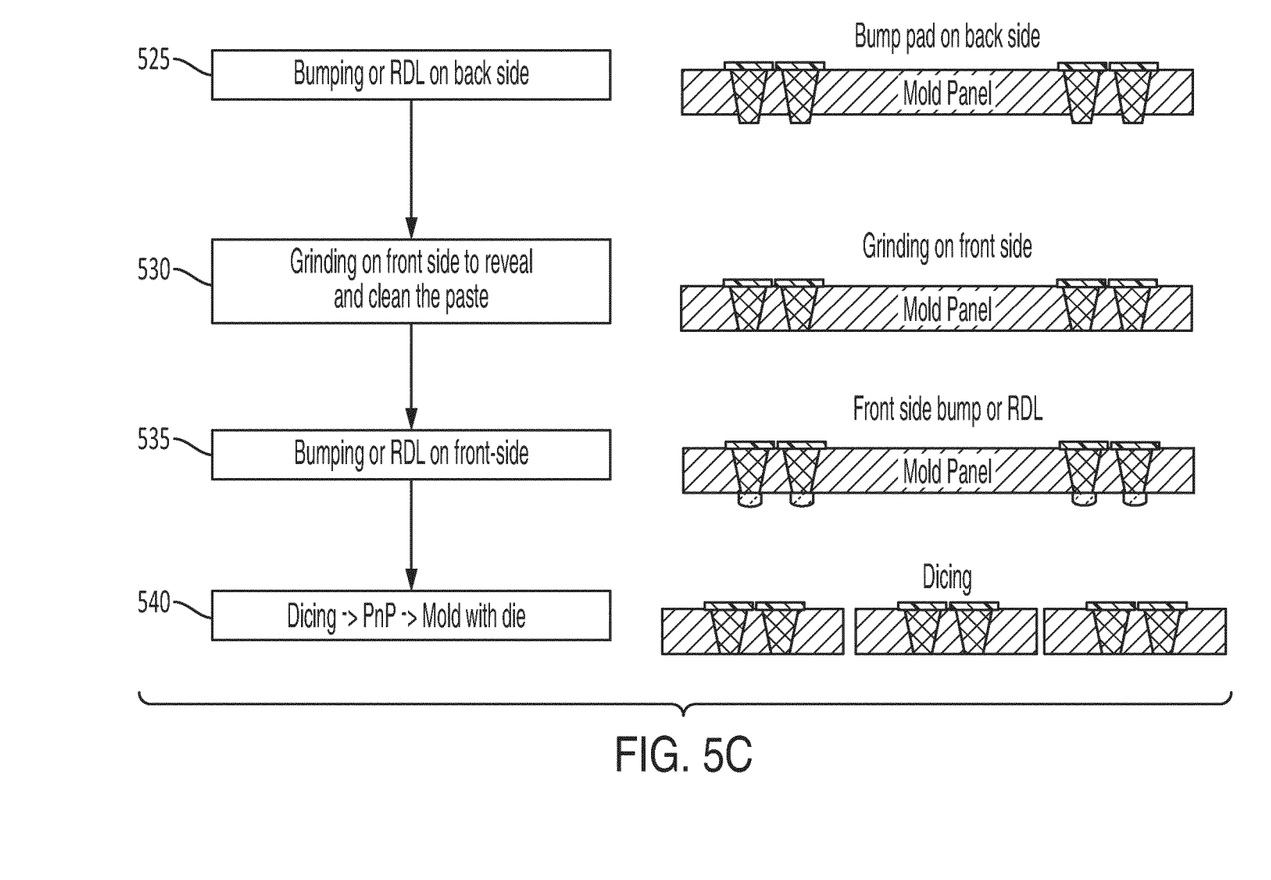
FIG. 5C is an illustrated flow chart of a portion of a method for fabricating a via frame, according to an embodiment of the present disclosure.

A method for fabricating a via frame according to FIG. 2A may include all of the steps of FIG. 5A and the steps of FIG. 5C (three of which are the same as those of FIG. 5B). In FIG. 5C, the plurality of second conductive bumps 120 is formed, at 535, (e.g., by electrolytic plating or solder paste printing) on the bottom surface of the sheet of epoxy mold compound after the bottom surface is ground flat at 530, and before the sheet is diced, at 540.

It will be understood that in some embodiments the values or ranges provided herein for dimensions, may be varied (e.g., increased by 50%, or decreased by 50%) while preserving some or all of the functionality of the corresponding embodiment. As such, where a value is disclosed herein for any dimension, in some embodiments, a value that is within 50% of the value disclosed may be employed instead. Where a single-ended range is disclosed for any dimension, a value that is within 50% of the endpoint of the range may be employed instead, in some embodiments. For example, FIG. 1B indicates that the bump thickness may be greater than 2 um (microns); in some embodiments the bump thickness may be within 50% of 2 um (i.e., it may be between 1 um and 4 um).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "primary component" refers to a component that is present in a composition, polymer, or product in an amount greater than an amount of any other single component in the composition or product. In contrast, the term "major component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present. As used herein, "a portion of" something means "at least some of" the thing, and as such may mean less than all of, or all of, the thing. As such, "a portion of" a thing includes the entire thing as a special case, i.e., the entire thing is an example of a portion of the thing, and, for example, "a portion of a layer" means all or less than all of the layer. As used herein, when a second number is "within Y %" of a first number, it means that the second number is at least (1−Y/100) times the first number and the second number is at most (1+Y/100) times the first number.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a through mold via frame have been specifically described and illustrated herein, many modifications and variations will be apparent to those skilled in the art. Accordingly, it is to be understood that a through mold via frame constructed according to principles of this disclosure may be embodied other than as specifically described herein. The invention is also defined in the following claims, and equivalents thereof.

What is claimed is:

1. An interposer, comprising: a photonic integrated circuit comprising a waveguide on a top surface of the photonic integrated circuit; and a via frame on the top surface of the photonic integrated circuit, and comprising: a sheet of epoxy mold compound, having a plurality of holes each extending through the sheet of epoxy mold compound, and a plurality of conductive elements, each extending through a respective one of the holes; a first electro-optical chip on the top surface of the photonic integrated circuit; and a second electro-optical chip on the top surface of the photonic integrated circuit, wherein the waveguide is optically coupled between the first and second electro-optical chips.

2. The interposer of claim 1, wherein the via frame comprises a plurality of first conductive bumps on a first surface of the sheet of epoxy mold compound, each of the first conductive bumps protruding away from the first surface of the sheet of epoxy mold compound and being directly on, and electrically connected to, a respective one of the plurality of conductive elements, and wherein each of the conductive elements is a metal-filled epoxy element.

3. The interposer of claim 2, wherein each of the conductive elements comprises copper-filled epoxy.

4. The interposer of claim 3, wherein the copper-filled epoxy comprises a plurality of silver-coated copper particles in a cured epoxy matrix.

5. The interposer of claim 2, wherein the sheet of epoxy mold compound has a thickness greater than 70 microns and less than 1000 microns.

6. The interposer of claim 2, wherein a center-to-center separation between two holes of the plurality of holes is greater than 100 microns and less than 300 microns.

7. The interposer of claim 2, wherein each of the first conductive bumps is composed of a material selected from the group consisting of copper, nickel, gold, and alloys and combinations thereof.

8. The interposer of claim 2, wherein each of the first conductive bumps has a diameter that exceeds a diameter, at the first surface, of the hole containing the conductive element to which the first conductive bump is electrically connected, by at least 4 microns.

9. The interposer of claim 2, further comprising a plurality of second conductive bumps on a second surface of the sheet of epoxy mold compound, each of the second conductive bumps protruding from the second surface of the sheet of epoxy mold compound and being electrically connected to a respective one of the plurality of conductive elements.

10. The interposer of claim 9, wherein each of the second conductive bumps is composed of a material selected from the group consisting of copper, gold, nickel, and solder.

11. The interposer of claim 10, wherein each of the second conductive bumps has a diameter that exceeds a diameter, at the second surface, of the hole containing the conductive element to which the second conductive bump is electrically connected, by at least 4 microns.

12. The interposer of claim 2, comprising: an electronic integrated circuit, on the photonic integrated circuit; and a plurality of conductive balls on a first surface of the via frame, wherein: the electronic integrated circuit is electrically connected to the first electro-optical chip, and a conductive element of the plurality of conductive elements of the via frame is part of a conductive path between the electronic integrated circuit and a conductive ball of the plurality of conductive balls.

13. A method for fabricating the interposer of claim 2, the method comprising: drilling, through the sheet of epoxy mold compound, the plurality of holes; filling each of the holes with a metal-filled epoxy paste, to form the plurality of conductive elements; grinding the first surface of the sheet of epoxy mold compound; forming the plurality of first conductive bumps on the first surface of the sheet of epoxy mold compound, each of the first conductive bumps protruding from the first surface of the sheet of epoxy mold compound and being electrically connected to a respective one of the plurality of conductive elements; grinding a second surface of the sheet of epoxy mold compound; and dicing the sheet of epoxy mold compound into a plurality of pieces.

14. The method of claim 13, further comprising forming a plurality of second conductive bumps on the second surface of the sheet of epoxy mold compound, each of the second conductive bumps protruding from the second surface of the sheet of epoxy mold compound and being electrically connected to a respective one of the plurality of conductive elements.

15. The method of claim 13, wherein the metal-filled epoxy paste is a copper-filled epoxy paste.

16. The method of claim 15, wherein the copper-filled epoxy paste comprises a plurality of silver-coated copper particles in a cured epoxy matrix.

17. The method of claim 13, wherein the sheet of epoxy mold compound has a thickness greater than 70 microns and less than 1000 microns.

18. The method of claim 13, wherein a center-to-center separation between two holes of the plurality of holes is greater than 100 microns and less than 300 microns.

19. The interposer of claim 1, wherein each of the conductive elements is a metal-filled epoxy element, and wherein a center-to-center separation between two adjacent holes of the plurality of holes is greater than 100 microns and less than 300 microns.

* * * * *